United States Patent [19]

Taniguchi et al.

[11] Patent Number: 5,742,498
[45] Date of Patent: Apr. 21, 1998

[54] MOTOR VEHICLE ALTERNATOR HAVING SEALED RECTIFIERS FOR EFFICIENT HIGH-TEMPERATURE OPERATION

[75] Inventors: Makoto Taniguchi, Oobu; Atsushi Umeda, Anjo; Shin Kusase, Oobu, all of Japan

[73] Assignee: Nippondenso Co., Ltd., Kariya, Japan

[21] Appl. No.: 657,677

[22] Filed: May 31, 1996

[30] Foreign Application Priority Data

Jun. 2, 1995 [JP] Japan ............. 7-136552

[51] Int. Cl.$^6$ ............. H02M 1/00; H02P 9/04
[52] U.S. Cl. ............. 363/145; 322/16
[58] Field of Search ............. 363/145; 310/62, 310/89; 322/10, 11, 14, 15, 16, 34; 257/77, 260

[56] References Cited

U.S. PATENT DOCUMENTS

| | | | |
|---|---|---|---|
| 4,168,459 | 9/1979 | Roesel, Jr. | 322/29 |
| 4,322,667 | 3/1982 | Ohba | 318/338 |
| 4,451,749 | 5/1984 | Kanayama et al. | 310/62 |
| 4,646,131 | 2/1987 | Amagasa et al. | 357/79 |
| 5,075,616 | 12/1991 | Mitsui | 322/10 |
| 5,396,085 | 3/1995 | Baliga | 257/77 |
| 5,543,703 | 8/1996 | Kusase et al. | 322/16 |

FOREIGN PATENT DOCUMENTS

| | | |
|---|---|---|
| 3-106868 | 11/1991 | Japan . |
| 4-138030 | 5/1992 | Japan . |

OTHER PUBLICATIONS

Tokura, et al. U.S. application No. 08/339,208 filed Nov. 10, 1994.

Umeda, et al. U.S. application No. 08/351,007 filed Dec. 7, 1994.

Umeda, et al. U.S. application No. 08/351,027 filed Dec. 7, 1994.

Kusase et al. U.S. application No. 08/362,408 filed Dec. 23, 1994.

Hara et al. U.S. application No. 08/418,147 filed Apr. 5, 1995.

Takeuchi et al. U.S. application No. 08/468,073 filed Jun. 6, 1995.

Umeda et al. U.S. application No. 08/624,215 filed Mar. 29, 1996.

Sato et al. U.S. application No. 08/638,746 filed Apr. 29, 1996.

Taniguchi et al. U.S. application No. 08/640,314 filed Apr. 30, 1996.

Palmour, et al: "6H–Silicon Carbide Power Devices for Aerospace Applications", Proceedings of the 28th Intersociety Energy Conversion Engineering Conference, vol. 1, Aug. 8–13, 1993, pp. 1,249–1,254.

*Primary Examiner*—Adolf Berhane
*Attorney, Agent, or Firm*—Cushman, Darby & Cushman IP Group of Pillsbury Madison & Sutro LLP

[57] ABSTRACT

An alternator includes MOSFETs used as rectifiers which are sealed by a sealing member (for example, a molded epoxy resin) together with heat radiating fins and an external input/output terminal plate. The sealing member can evenly dissipate stress even if the radiating fins, terminal plate, and the like vibrate with different phases. Since the rectifying elements are reliably secured even when subjected to great vibrations, damage to the MOSFETs can be suppressed. The MOSFETs are never exposed to atmospheric air since the MOSFETs are sealed by the sealing member. Therefore, the alternator can improve the MOSFETs' resistance against adverse operational conditions.

22 Claims, 9 Drawing Sheets

MOTOR VEHICLE ALTERNATOR HAVING SEALED RECTIFIERS FOR EFFICIENT HIGH-TEMPERATURE OPERATION

CROSS-REFERENCE TO RELATED APPLICATIONS

The present application is related to and claims priority from Japanese Patent Application No. Hei 7-136552, incorporated herein by reference.

BACKGROUND OF THE INVENTION

1. Field of the invention

This invention relates to an alternator having a rectifier in which an AC output generated at an armature winding is rectified and converted to a DC output and, more particularly, to a rectifier for a motor vehicle alternator to be attached to an internal combustion engine mounted in a vehicle.

2. Description of Related Art

Generally, a three-phase full wave rectifier is used in a conventional motor vehicle alternator. As shown in FIG. 13, a rectifier 200 includes a positive radiating fin 202 collecting currents of three or four positive pn-junction silicon diodes 201 and radiating the heat therefrom, a negative radiating fin 204 collecting currents of three or four negative pn-junction silicon diodes 203 and radiating the heat thereof, a terminal plate 205 electrically insulating the radiating fins 202, 204 from one another and securing the fins 202, 204 to a casing of a motor vehicle alternator, and the like. The terminal plate 205 of the rectifier 200 is integrally molded with an insulating plastic resin material, because the terminal plate covers AC input terminals for supplying AC outputs from an armature winding for respective phases of the motor vehicle alternator to the positive pn-junction silicon diodes 201 through wires 206, 207.

Such a conventional motor vehicle alternator is in many cases attached directly to the engine body and therefore always receives large vibrations. In particular, the three-phase full wave rectifier 200 does not have an integrated configuration of the positive and negative radiating fins 202, 204 and the terminal plate 205, thereby generating complex vibrations due to different vibration modes among those members. As a result, there arises a problem that stress may concentrate at the wires of the rectifying elements and cause great damage to the rectifying elements.

As one approach to solve such a problem, rectifying elements and their wires are molded with a resin material to secure them to the positive and negative radiating fins. When the rectifying elements are diodes, the rectifying elements produce so much heat that cooling of the rectifying elements must rely on heat transfer since the heat is hardly radiated, thereby causing a problem that the alternator is prevented from being made more compact.

Alternatively, MOSFET (metal-oxide-silicon type field effect transistor) devices using silicon as a semiconductor material, which is capable of reducing loss, and silicon oxide as a surface insulator, can be used as rectifying elements. However, the temperature of such devices, though each device produces only a small amount of heat, may well exceed the MOSFET's heat resistant temperature, because their operational environment is at a very high temperature. Accordingly, the rectifier must be used together with a relatively sizable cooling device, thereby preventing the motor vehicle alternator from being made compact.

SUMMARY OF THE INVENTION

In view of the above problems of the prior art, it is an object of the invention to provide an alternator capable of sufficiently ensuring strength of rectifying elements even when subject to great vibrations.

It is another object of the invention to provide an alternator having smaller radiating fins which are operable without a sizable cooling device for a rectifier of the alternator.

It is a further object of the invention to provide an alternator having improved reliability by preventing a rectifier of the alternator from exposing itself to atmospheric air.

The above objects are achieved in a first aspect of the present invention by providing an alternator in which, upon rotation of a field magnet driven by a drive source, an AC current is induced in an armature winding of an armature according to the rotation of the field magnet, thereby quickly raising a voltage generated in the armature winding. The AC current generated in the armature winding is fed to a MOSFET through external input/output terminals and is converted to a DC current by rectifying the AC current. When the generated voltage exceeds a battery voltage, the DC current is fed to the battery, thereby charging the battery through a charging current flowed to the battery.

With the alternator, such as a motor vehicle alternator, the armature winding and the field magnet deal with large amounts of magnetic energy. To cope with a problem when such magnetic energy is discharged quickly, the breakdown voltage of rectifying elements must be designed to be, for example, 300 volts, which is at least twenty times the DC output voltage of the rectifier. Moreover, a large output current of 100 Amperes or more is required because of increased electric loads mounted on present-day vehicles. The breakdown electric field intensity is about 400 volt per micron-meter in silicon carbide (SIC), which is thirteen times higher than that of silicon (Si). In other words, a loss of electrical power in the MOSFET can be greatly reduced when silicon carbide is utilized for the rectifying elements, since the breakdown electric field intensity of the silicon carbide is particularly high in comparison with that of silicon.

With such an alternator, the MOSFET is sealed by a sealing member (for example, a molded epoxy resin) with either or both of the radiating fins and the external input/output terminals. The sealing member can evenly dissipate stress even if the radiating fins, terminal plate, and the like vibrate with the different phases. Since the rectifying elements are reliably secured even under great vibrations, damage to the rectifying elements and the MOSFET can be suppressed. The MOSFET using silicon carbide as a semiconductor material is a rectifying device operable even if it reaches a high temperature due to heat accumulated inside the sealing member because the MOSFET has a high heat resistance. Therefore, the alternator can make the radiating fin for cooling the rectifying device more compact and can make a specially-sized cooling device unnecessary. The MOSFET is never exposed to atmospheric air since the MOSFET is sealed by a sealing member (for example, a molded epoxy resin) with either or both of the radiating fins and the external input/output terminals. Therefore, the alternator can improve the MOSFET's resistance against adverse operational conditions.

Preferably, the rectifier has a crescent shape to complement inner rounded shape of the housing of the alternator so that the rectifier is efficiently disposed in the housing of the alternator. Positive and negative radiating fins can be mounted within the housing of the alternator in a double-decker fashion so that the cooling capacity of the MOSFET can be improved since the double-decker form guarantees sufficient areas of the positive and negative radiating fins. The housing of the alternator can be made more compact because even smaller positive and negative radiating fins guarantee a sufficient cooling performance, thereby allowing the MOSFETs to be aligned at narrow intervals between the bodies on the positive and negative radiating fins.

MOSFETs made of silicon carbide and pn-junction diodes made of silicon or silicon carbide can be held on the radiating fins as positive and negative rectifying elements, respectively, or as negative and positive rectifying elements, respectively, thereby reducing the manufacturing cost of the rectifier. Other semiconductor switching elements such as MOSFETs made of silicon can be assembled instead of the pn-junction diodes. The alternator can facilitate processes such as wire bonding, wiring, and soldering, thereby reducing the assembly costs, because drain electrodes electrically coupled to an AC input terminal, source electrodes electrically coupled to the positive or negative radiating fin and gate electrodes electrically coupled to a controller are formed on the surfaces of the plural positive and negative MOSFETs.

A positive-type well region made of silicon carbide can be formed on the surface of a negative-type anti-breakdown layer made of silicon carbide after the negative-type anti-breakdown layer is formed on a high concentration negative-type substrate. A high concentration negative-type drain region made of silicon carbide as a semiconductor material is formed on the surface the positive-type well region, and a gate electrode forming a negative-type channel is formed on the surface of the positive-type well region through an insulating layer. A source electrode is formed on the back surface of the high concentration negative-type substrate while a drain electrode is formed on the surface of the high concentration negative-type drain region. As a result, a MOSFET made of silicon carbide having high breakdown resistance and low power loss, can readily manufactured.

In a rectifier of a motor vehicle alternator, the positive-type well region is generally connected to either the source electrode or the drain electrode to apply a voltage to the positive-type well region. However, if a parasitic diode on a source connection side is short-circuited where the positive-type well region is connected to the source electrode, a reverse current may flow through a parasitic diode on a drain connection side if the generated voltage connected to the drain electrode of the MOSFET becomes lower than the voltage of a battery. To prevent such a reverse current flowing through the parasitic diode on the drain connection side from occurring, the positive-type well region may be short-circuited to the drain electrode. The parasitic diode on the source connection side can prevent reverse current flow from the battery from occurring.

Respective positive-type wells with respect to each phase can be individually formed on the high concentration negative-type substrate, which constitutes a high concentration negative-type common source region of the respective MOSFETs corresponding to the polyphase armature winding. Each gate electrode is individually formed on the surface of the corresponding positive-type well through an insulating layer for forming a negative-type channel. Therefore, the positive and negative MOSFETs can be implemented as a single chip, thereby reducing the number of assembly parts and the size of the polyphase full wave rectifier.

The positive MOSFET and respective electrodes, such as the drain, source, and gate electrodes, are secured to the positive radiating fin by a sealing member (for example, a molded epoxy resin) while the negative MOSFET and respective electrodes are secured to the negative radiating fin by the sealing member. Therefore, even if the positive and negative radiating fins, terminal plate and the like vibrate with different phases, the sealing member can dissipate stress evenly, thereby suppressing damage affecting the positive and negative MOSFETs and the electrodes. Since the positive and negative MOSFETs and the electrodes are never exposed to atmospheric air, the MOSFETs and electrodes in the alternator can have improved resistance against adverse operating conditions.

A controller for performing switching control of the MOSFETs can be mounted on the same plate as the MOSFETs, thereby shortening wiring between the MOSFETs and the controller and making the alternator more compact. The sealing member prevents the wires connecting the MOSFETs and the controller from being exposed, thereby avoiding the situation where the wires are eroded by water, and improving the device's resistance against adverse operating conditions. In addition, MOSFETs can be made of silicon carbide to incur a lower power loss with respect to the same breakdown voltage than that MOSFETs made of silicon.

Other objects and features of the invention will appear in the course of the description thereof, which follows.

BRIEF DESCRIPTION OF THE DRAWINGS

Additional objects and advantages of the present invention will be more readily apparent from the following detailed description of preferred embodiments thereof when taken together with the accompanying drawings in which.

DETAILED DESCRIPTION OF THE PRESENTLY PREFERRED EXEMPLARY EMBODIMENTS

Figure 1:
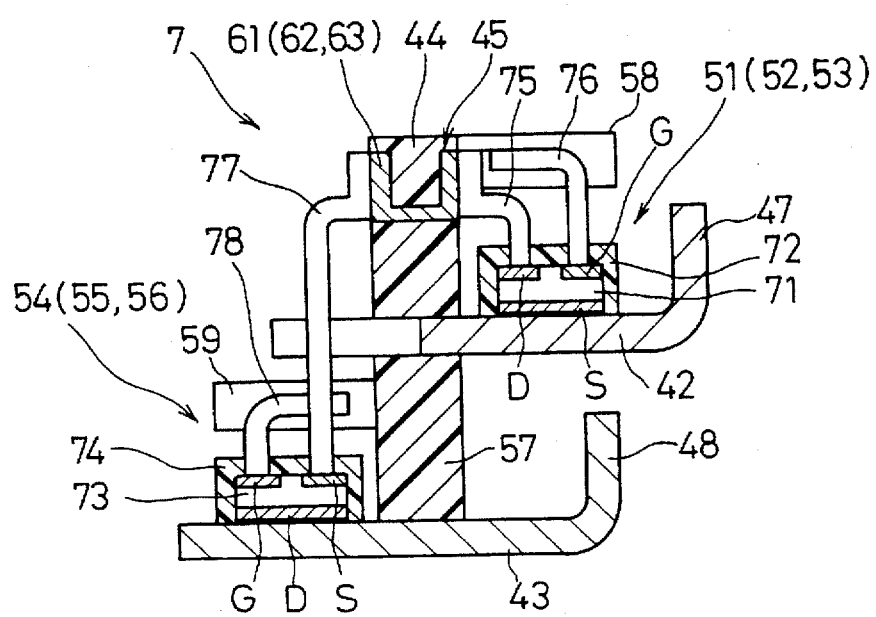
FIG. 1 is a cross-section showing a portion of a three-phase full wave rectifier of a motor vehicle alternator according to a preferred embodiment of the present invention.

Referring to FIGS. 1 to 4, a motor vehicle alternator according to an embodiment of invention is shown in detail.

An automobile alternator unit 1 (shown in FIG. 3) is a vehicle charging apparatus for charging a battery 2 (shown in FIG. 4) mounted on an automobile and for feeding electrical power to electrical equipment (i.e., vehicle electrical loads) mounted on the automobile. The automobile alternator unit 1 includes a motor vehicle alternator 3 attached to an internal combustion engine (not shown) and installed in an engine compartment with a bracket, a voltage regulator 8 for regulating an output voltage of a three-phase armature winding 25 of the motor vehicle alternator 3 by detecting the output voltage of the three-phase armature winding 25 and by controlling an excitation current by supplying a part of the output current to a field winding 11, and the like.

Figure 3:
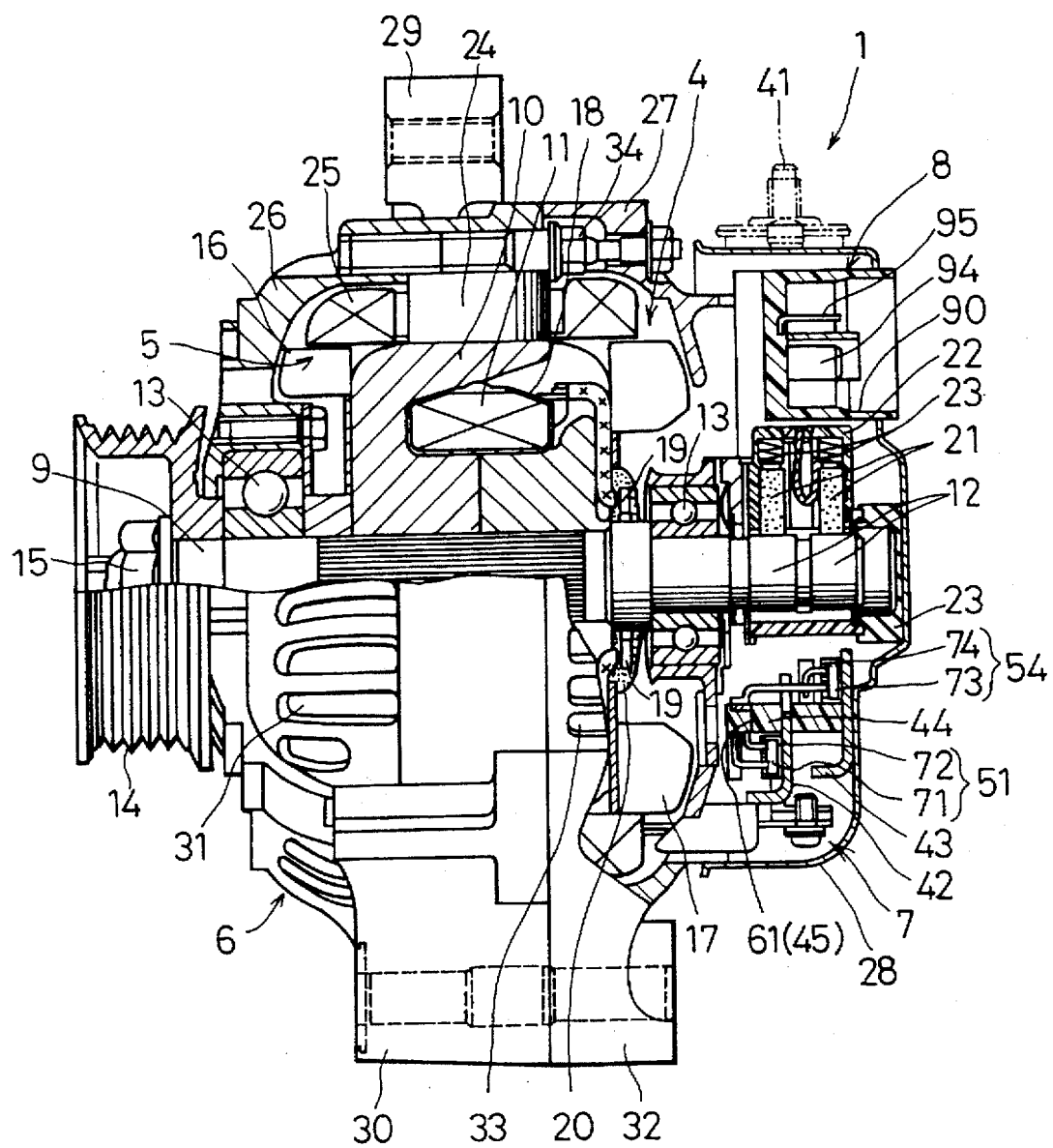
FIG. 3 is a cross-section showing the entire structure of a motor vehicle alternator according to the embodiment.

Referring to FIG. 3, the motor vehicle alternator 3 of the automobile alternator system 1 is shown in detail. The motor vehicle alternator 3 includes a rotor 4, a stator 5 rotating in correspondence with the rotor 4, a housing 6 within which the rotor 4 and the stator 5 are contained, a three-phase full wave rectifier 7 converting an AC current into a DC current by rectifying the DC output of the stator 5, and the like. The motor vehicle alternator 3 generates electric power when rotary power is applied thereto.

The rotor 4 is, as shown in FIG. 3, a member serving as a field magnet which rotates in unison with a rotor shaft 9. The rotor 4 includes, for example, a Lundell type pole core (occasionally referred as to a field pole, a field iron core, a rotor iron core, or a rotor core) 10, a field winding (occasionally referred as to a rotor winding, a rotor coil, or a field coil) 11, and two slip rings 12.

The rotor shaft 9 is rotatably supported by two ball bearing assemblies 13 at the inner peripheral side of the housing 6. A V-ribbed pulley or a pulley for a poly V-belt 14 is attached to one end (distal end) of the rotor shaft 9 by an enlarged base nut 15 to transmit the rotary power of the engine. The V-ribbed pulley 14 is engaged with a pulley for a poly V-belt fixed to the output shaft of the engine by way of transmitting means such as a poly V-belt. The rotor shaft 9 can be engaged directly with the output shaft of the engine, and also, a transmission device such as a gearing transmission of one or more stages or a belt-driven transmission can be connected between the rotor 9 shaft 9 and the output shaft of the engine.

The pole core 10 has the field winding 11 wound around the center of the core. When an excitation current flows through the field winding 11, one of the claw pole members assumes a north magnetic polarity whereas the other of the claw pole members assumes a south magnetic polarity. A cooling fan (e.g., an axial flow type fan) 16 is attached to a front face of the one claw pole member by welding, for example, for intake of cooling air into the housing 6. Another cooling fan (e.g., a centrifugal fan) 17 is attached to a rear face of the other claw pole member by, e.g., welding for intake of cooling air into the housing 6 and for blowing the cooling air to the stator 5. The field winding 11 is wound around the center of the core 10 by a coil bobbin 18. Both ends of the field winding 11 are electrically connected to shaft connection bars (e.g., slip ring terminals) 19, respectively. An insulating material 20 covers connecting portions between the ends of the field winding 11 and the shaft connection bars 19.

The two slip rings 12 are attached to the outer periphery of the other end (rear end) of the shaft 9. Each outer periphery of the slip rings 12 is in contact with one of two brushes 21. The two brushes 21 are supported within a brush holder 22 and biased towards the outer periphery of the two slip rings 12 by a coil spring 23. The two brushes 21 are electrically connected to two terminals that are inserted in and molded with the brush holder 22. The brush holder 22 is made of a resin material. A seal member 23 made of rubber is attached between the rear end of the brush holder 22 and the housing 6 for preventing water or moisture from entering into the brush holder 22 so that the two slip rings 12 and the two brushes 21 stay away from the water and moisture.

The stator 5, as shown in FIG. 3, is a stationary element serving as an armature. The stator 5 includes an armature iron core (occasionally referred to as a stator core) 24 facing the outer periphery of the claw pole member pair of the pole core 10, the three-phase armature winding 25 (occasionally referred as to a stator winding, a stator coil, or a stator coil) wound around the armature iron core 24, and the like. The armature iron core 24 is a multilayer core in which multiple thin steel plates made of a magnetic material overlap and is formed as a united body inside of the housing 6. The armature iron core 24 forms a magnetic flux path so that the magnetic flux coming out of the claw pole member pair of the pole core 10 effectively intersects with the three-phase armature winding 25. Many slots (not shown) are formed at the same intervals in the inner periphery of the armature iron coil 24.

Figure 4:
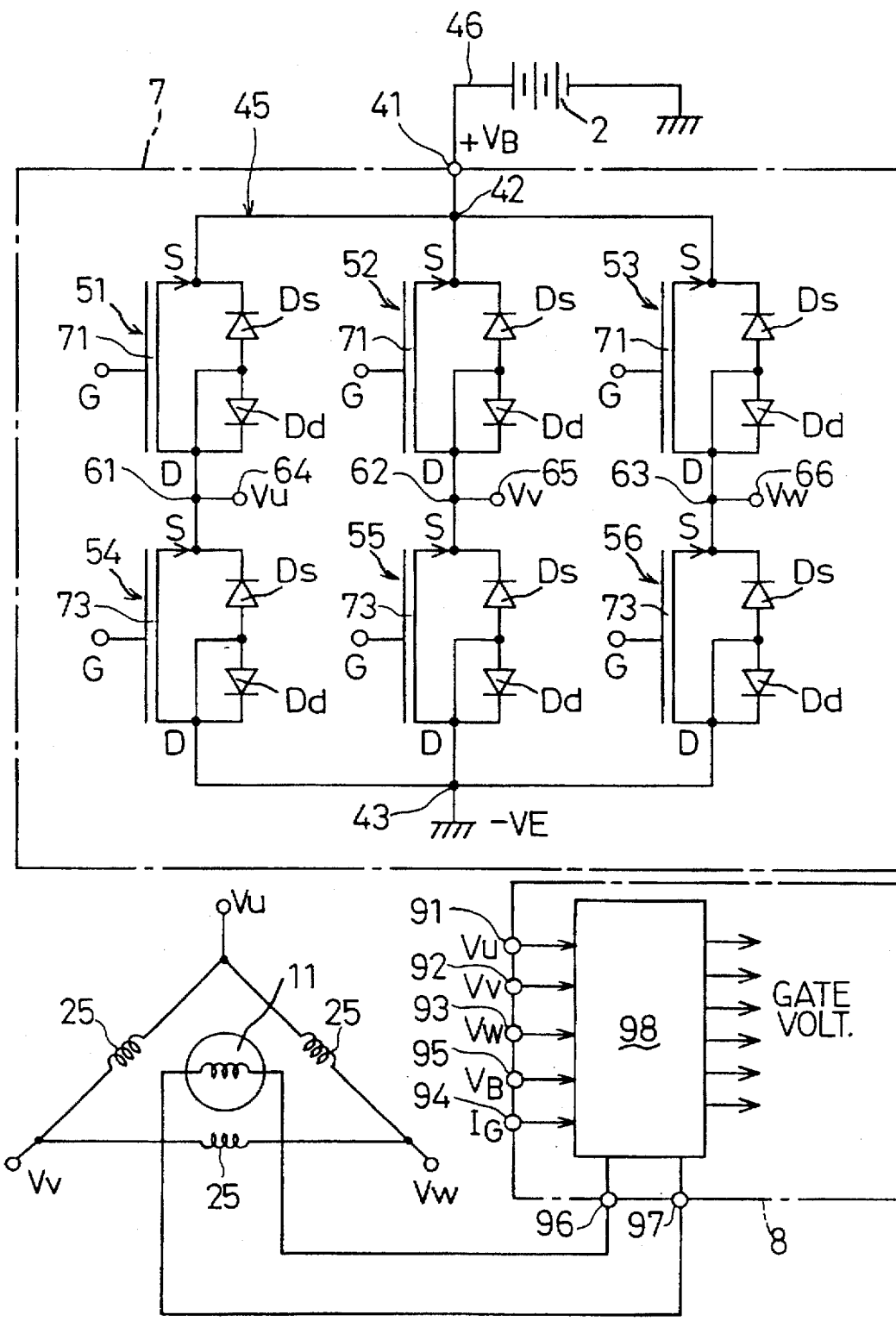
FIG. 4 is a circuit diagram showing the three-phase full wave rectifier in FIG. 1 and its armature winding for three phases.

As shown in FIG. 4, the three-phase armature winding 25 includes a U-phase armature winding, a V-phase armature winding, and a W-phase armature winding, which are coupled by a delta interconnection. The three-phase armature winding 25 serves as a winding inducing a three-phase AC output in accordance with the rotation of the rotor 4 and is inserted in many slots formed along the inner periphery of the armature iron core 24. A wye (Y) interconnection can alternatively be used to interconnect the three-phase armature winding 25.

The housing 6 serves as an outer casing of the motor vehicle alternator 3 as shown in FIG. 3. The housing 6 includes a drive frame (occasionally referred as to a front housing) 26, a rear frame (sometimes referred as to a rear housing) 27, a rear cover (also referred as to an end cover) 28, and the like. The drive frame 26 is made as a united body by aluminum die casting. The drive frame 26 rotatably supports the front end of the rotor 4 with the ball bearings 13 and is formed integrally with stays 29, 30 for fixing the housing 6 to the engine. Many louvers 31 for passing cooling air sent by the rotations of the cooling fans 16, 17 therethrough are disposed in the drive frame 26. The rear frame 27 is an integral aluminum die cast body. The rear frame 27 rotatably supports the rear end of the rotor 4 with the ball bearing 13 and is formed integrally with a stay 32 for fixing the housing 6 on the engine. Many louvers 33 for passing cooling air sent by the rotations of the cooling fans 16, 17 therethrough are disposed in the rear frame 27. The rear frame 27 is secured to the drive frame 26 by plural connectors such as stud bolts and nuts. The rear cover 28 is integrally molded by using a press of a metal plate made of, for example, aluminum. The rear cover 28 contains, between the rear frame 27 and itself, the voltage regulator 8, the other end of the shaft 9, the two slip rings 12, the two brushes 21, and the brush holder 22. Many louvers (not shown) for passing cooling air sent by the rotations of the cooling fans 16, 17 therethrough are disposed in the rear cover 28, which is grounded to the body and constitutes a DC output terminal of the three-phase full wave rectifier 7.

The three-phase full wave rectifier 7 of the motor vehicle alternator 8 will now be described. The three-phase full wave rectifier 7 includes a DC output terminal 41, a positive radiating fin 42, a negative radiating fin 43, a terminal plate 44, a lead frame 45, three positive silicon carbide based MOSFETs ("SiC-MOSFETs") 51 to 53, and three positive-negative SiC-MOSFETs 54 to 56.

Figure 2:
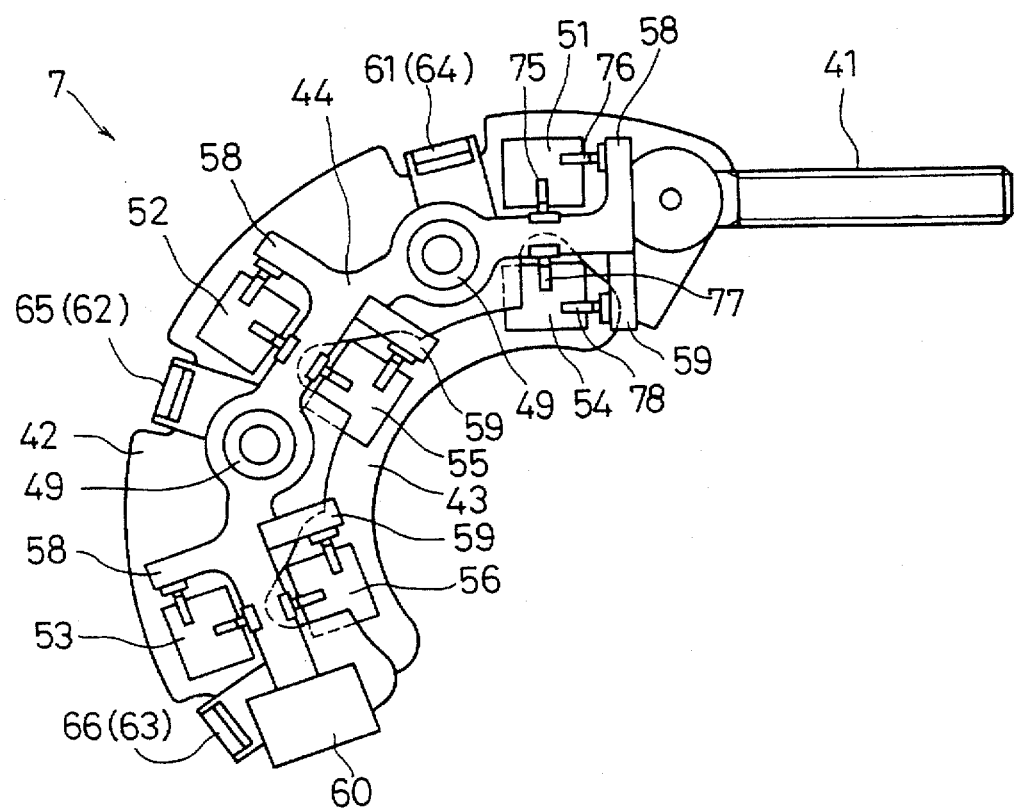
FIG. 2 is a plan view showing the three-phase full wave rectifier of FIG. 1.

The DC output terminal (occasionally referred as to a DC output positive terminal or B terminal bolt) 41 is, as shown in FIGS. 2 to 4, electrically connected to the battery 2 through a conductor 46 at one end of the terminal. The other end of the DC output terminal 41 is electrically connected to one terminal of the brushes 21, positive radiating fin 42, and a lead frame 45 as described below by threading screws (not shown). The DC output terminal 41 is a terminal supplying a charging current to the battery 2 and constitutes the B terminal of the automobile alternator system 1.

The positive radiating fin 42 is a radiating fin having a collector function for a positive electrode of the battery 2 and a heat radiating function. The positive radiating fin 42 is integrally formed in a crescent shape to conform to the inner rounded surface of the rear cover 28 and to surround the brush holder 22. The positive radiating fin 42 conforms with the rear side face of the rear frame 26 and is assembled within the rear cover 28.

On the other hand, the negative radiating fin 43 is a radiating fin having a collector function for a negative electrode of the battery 2 and a heat radiating function. The negative radiating fin 43, similarly to the positive radiating fin 42, is integrally formed in a crescent-shape to conform to the inner rounded surface of the rear cover 28 and surround, for example, the brush holder 22. The negative radiating fin 43 is placed at a deeper position in the rear cover 28 than the positive radiating fin 42 to overlap the positive radiating fin 42 in a different plane, or to form a double decker configuration. The negative radiating fin 43 is grounded to the body via contact with the rear cover 28. The negative radiating fin 43 constitutes an electrical potential portion with the positive radiating fin 42.

The positive and negative radiating fins 42, 43 are made from a conductive metal plate such as a copper plate or an aluminum plate having an excellent thermal conductivity. The positive and negative radiating fins 42, 43 have rising walls 47, 48 standing against the flowing direction of cooling air to make heat easily radiate from the three positive SiC-MOSFETs 51 to 53 and the three negative SiC-MOSFETs 54 to 56. The three positive SiC-MOSFETs 51 to 53 and the three negative SiC-MOSFETs 54 to 56 are mounted on the surfaces of the positive and negative radiating fins 42, 43, respectively, with predetermined spaces therebetween on respective arcs so that complementary pairs of positive and negative SiC MOSFETs aligned radially. Two through holes are formed in the positive and negative radiating fins 42, 43. The positive and negative radiating fins 42, 43 are connected to each other by two pipe rivets inserted in the through holes, respectively, and by the terminal plate 44 so that one is electrically isolated from and is maintained at a predetermined distance from the other. The fixtures such as stud bolts are inserted in the two pipe rivets 49 to secure the positive and negative radiating fins 42, 43 and the terminal plate 44 to the rear frame 27.

The terminal plate 44, as shown in FIGS. 1 to 3, is made of an insulating resin material such as polyphenylene sulfide (PPS) resin, which is highly rigid and stable in size and is integrally molded into a thin plate in a crescent shape. The terminal plate 44 seals a portion of the lead frame 45. The terminal plate 44 is placed closer to the rear frame 27 than the positive radiating fin 42 and has two cylindrical members (not shown) and three cylindrical portions (temporary engaging portions) 57 projecting therefrom toward the negative radiating fin 43 to temporarily engage the negative radiating fin 43 with the positive radiating fin 42.

The two cylindrical members penetrate the through holes in the positive radiating fin 42. The tips of the members are inserted between the negative radiating fin 43 and the pipe rivet 49. The three cylindrical portions are coupled to the positive radiating fin 42 or the negative radiating fin 43 by screws passing through the inside of the cylindrical portions to maintain an insulating distance between the positive and negative radiating fins 42, 43. Three positive arms 58 in a cylindrical form are projected from the outer side periphery of the terminal plate 44. Three negative arms 59 are also projected from the inner side periphery of the cylindrical portions 57. A connector 60 is unitedly formed at an end of the terminal plate 44 on a side of the voltage regulator 8, or an end opposite the DC output terminal 41 of the terminal plate 44 to surround three positive gate signal input terminals (not shown) and three negative gate signal input terminal (not shown). The connector 60 can be formed as a separate member made of an insulating resin material.

The lead frame 45, as shown in FIGS. 2 and 4 to 6, is made from a thin conductive plate made of a metal such as copper or aluminum and is formed with three AC input terminals 61 to 63, three positive gate signal input terminals, three negative gate signal input terminals, and the like.

The three AC input terminals 61 to 63, as shown in FIGS. 2 to 6, constitute external input/output terminals of the invention as well as conductors (terminals for detecting power generation, or P terminals) for electrically connecting the three-phase armature winding 25 to the corresponding positive SiC-MOSFETs 51 to 53 and the corresponding negative SiC-MOSFETs 54 to 56. The AC input terminals 61 to 63 are sealed within the terminal plate 44 so that almost the entire parts of the terminals are covered by the terminal plate 44 except a U-phase terminal 64, a V-phase terminal 65, and a W-phase terminal 66. The three positive gate signal input terminals constitute external input/output terminals of the invention as well as conductors (positive gate signal transmission lines) for electrically connecting the voltage regulator 8 to the gate electrodes, as described below, of the positive SiC-MOSFETs 51 to 53. The positive gate signal input terminals are sealed within the terminal plate 44 in a state such that almost the entire parts of the terminals are covered by the terminal plate 44 and the positive arms 58 except connecting portions of the voltage regulator 8 in the connector 60. The three negative gate signal input terminals constitute external input/output terminals of the invention as well as conductors (negative gate signal transmission lines) for electrically connecting the voltage regulator 8 to the gate electrodes, as described below, of the negative SiC-MOSFETs 54 to 56. The negative gate signal input terminals are sealed within the terminal plate 44 so that almost the entire parts of the terminals are covered by the terminal plate 44 and the negative arms 59 except connecting portions of the voltage regulator 8 in the connector 60.

Referring to FIGS. 1 to 6, the three positive SiC-MOSFETs 51 to 53 and the three negative SiC-MOSFETs 54 to 56 of the three-phase full wave rectifier 7 are described. The three positive SiC-MOSFETs 51 to 53 and the three negative SiC-MOSFETs 54 to 56 are rectifying elements (semiconductor elements of the three-phase full wave rectifier 7) for converting an AC output of the three-phase armature winding 25 to a DC output by rectifying the output.

The three positive SiC-MOSFETs 51 to 53 are electrically connected to the surface (front side face) of the positive radiating fin 42 by means such as soldering. The three negative SiC-MOSFETs 51 to 53 are electrically connected to the surface (front side face) of the negative radiating fin 43 by means such as soldering. Each of the three positive SiC-MOSFETs 51 to 53 includes a positive MOSFET body 71 and a sealing member 72 for sealing the entire positive MOSFET body 71. The sealing member 72 is made of an insulating, highly adhesive resin material such as epoxy resin and seals the positive MOSFET body 71, as well as a drain electrode D, a source electrode S, and a gate electrode G, on the surface of the positive radiating fin 42. Each of the three negative SiC-MOSFETs 54 to 56 includes a negative MOSFET body 73 and a sealing member 74 for sealing the entire negative MOSFET body 73. The sealing member 74 is, similar to the sealing member 72, made of an insulating, highly adhesive resin material such as epoxy resin and seals the negative MOSFET body 73, as well as a drain electrode D, a source electrode S, and a gate electrode G, on the surface of the negative radiating fin 43.

As shown in FIGS. 1 and 2, the drain electrodes D of the positive MOSFET bodies 71 of the three positive SiC-MOSFETs 51 to 53 are electrically connected to the corresponding AC input terminals 61 to 63 through wires 75. The source electrodes S of the positive MOSFET bodies 71 are electrically connected to the surface of the positive radiating fin 42 by soldering. The gate electrodes G of the positive MOSFET bodies 71 are electrically connected to the corresponding positive gate signal input terminals through wires 76. Similarly, the drain electrodes D of the negative MOSFET bodies 73 of the three negative SiC-MOSFETs 54 to 56 are electrically connected to the surface of the negative radiating fin 43 by soldering. The source electrodes S of the negative MOSFET bodies 73 are electrically connected to the corresponding AC input terminals 61 to 63, respectively, through wires 77. That is, the source electrodes S of the negative MOSFET bodies 73 of the three negative SiC-MOSFETs 54 to 56 are electrically connected to the corresponding drain electrodes D of the positive MOSFET bodies 71 of the positive SiC-MOSFETs 51 to 53 through the AC input terminals 61 to 63. The gate electrodes G of the negative MOSFET bodies 73 are electrically connected to the corresponding negative gate signal input terminals through wires 78.

Figure 5A:
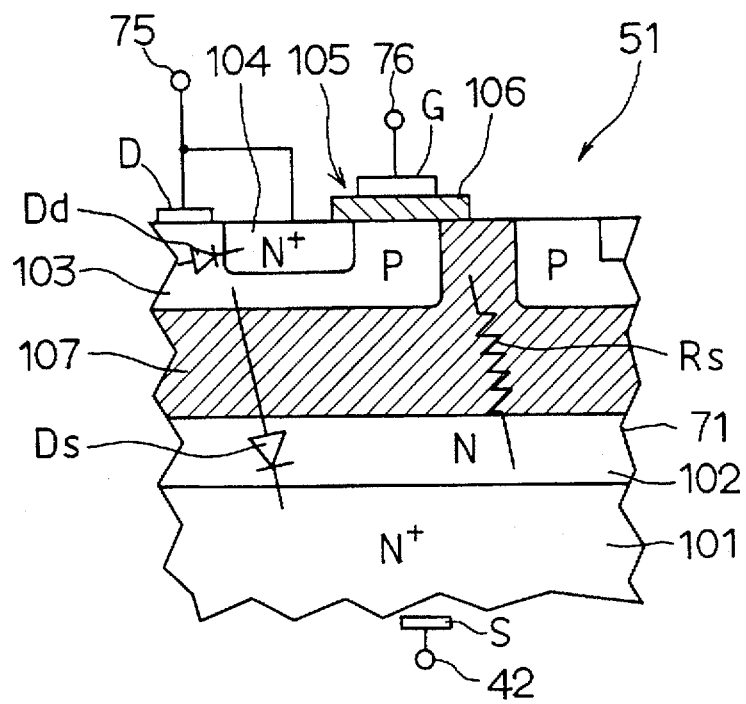
FIGS. 5A and 5B are cross-sections showing examples of a positive MOSFET according to the embodiment.
Figure 5B:
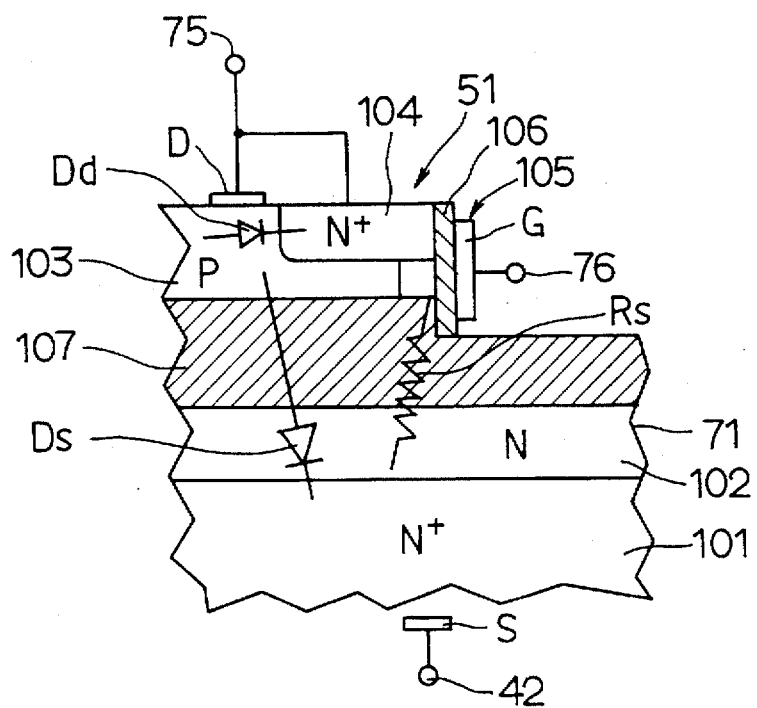

Referring to FIG. 5, a fabricating method for the positive MOSFET body 71 is described. To fabricate the positive MOSFET body 71, first, a negative-type anti-breakdown layer (n-type semiconductor) 102 made of SiC is epitaxially grown on a high concentration negative-type substrate 101 (n+ type semiconductor) made of SiC. A positive-type well region (i.e., a p-type semiconductor region) 103 made of SiC is then formed on the surface of the negative-type anti-breakdown layer 102 by ion-implantation of aluminum ions. A high concentration negative-type drain region (i.e., an n+ type semiconductor region) 104 made of SiC is formed on the surface of the positive-type well region 103 by ion implantation of nitrogen. Reference numeral 107 represents a depletion layer of the negative-type anti-breakdown layer 102.

A trench 105 is formed on the wafer surface by a well-known dry etching technique such as RIE (Reactive Ion Etching) by masking the surface with a resist or insulating layer in which regions for trenches are opened. After a gate insulating layer 106 made of silicon oxide is formed on the surface of the trenches 105 by a thermal oxidation method, a gate electrode G made of doped polysilicon is formed on the trench 105. A drain electrode D made of a conductive metal is formed in contact with the surfaces of the high concentration negative-type drain region 104 and the positive-type well region 103. Finally, a source electrode S made of a conductive metal is formed in contact with the back surface of the high concentration negative-type substrate 101.

Figure 6A:
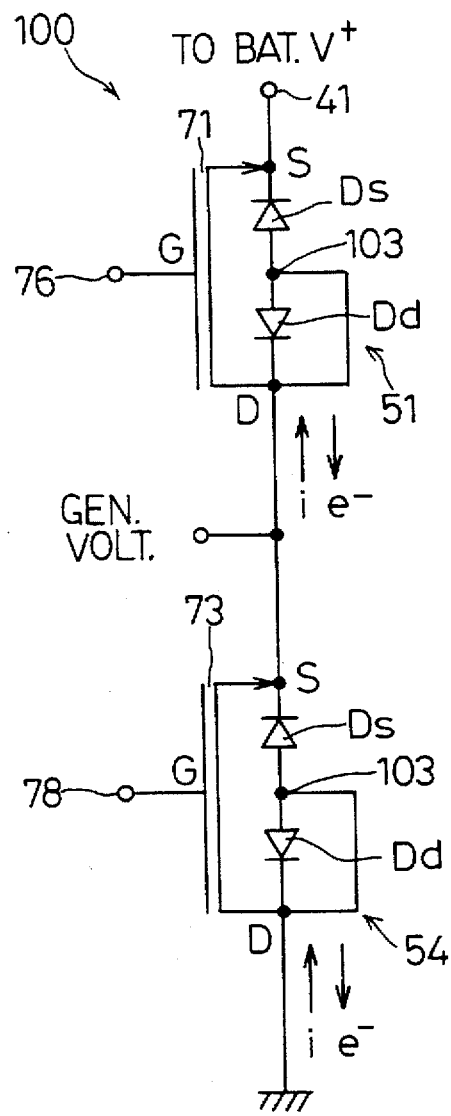
FIGS. 6A and 6B are equivalent circuits of an inverter circuit showing a U-component of the three-phase full wave rectifier shown in FIG. 4.
Figure 6B:
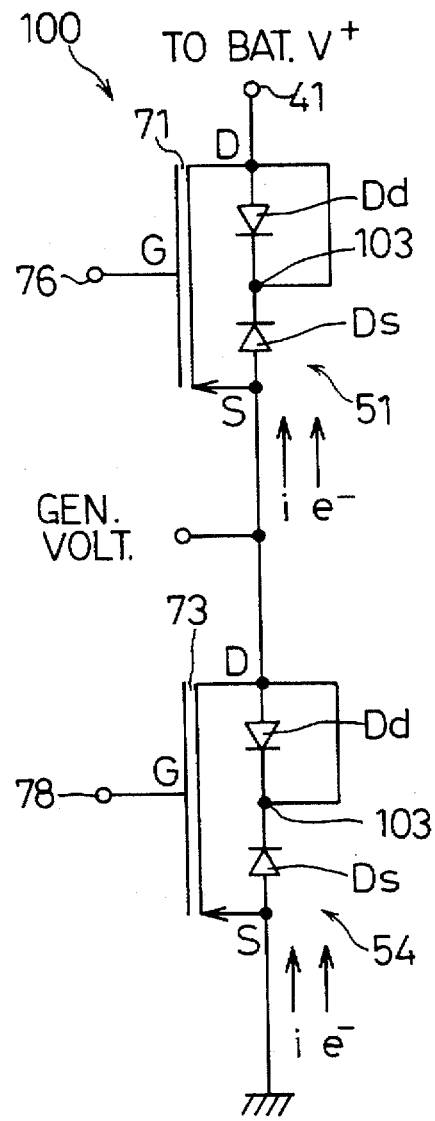

FIGS. 6A and 6B show inverter circuits including a U-phase portion of the SiC-MOSFET type three-phase full wave rectifier in which the SiC material is used for the positive and negative semiconductor materials and in which the silicon oxide is used as the gate insulating layer at the surface.

As shown in FIG. 6A, in the inverter circuit 100 of the n-channel type SiC-MOSFETs, the drain electrode D of the MOSFET body 71 of the positive SiC-MOSFET 51 and the source electrode S of the MOSFET body 73 of the negative SiC-MOSFET 54 are connected to the U-phase output end of the three-phase armature winding 25 through the AC input terminal 61. The drain electrode D of the MOSFET body 73 of the negative SiC-MOSFET 54 is coupled to the negative terminal (minus end) of the battery 2 whereas the source electrode S of the MOSFET body 71 of the positive SiC-MOSFET 51 is coupled to the positive terminal (plus end) of the battery 2. In the case of the negative-type channel in FIG. 6A, as opposed to the case of the positive channel in FIG. 6B, the current direction for charge during charge of the battery is opposite to the electrons direction of travel, and the source electrode S denotes the electrode for supplying carrier charges to the channel during charge of the battery.

In the MOSFET bodies 71, 73 of the positive and negative SiC-MOSFETs 51, 54, although a parasitic diode Ds on the source coupling side and a parasitic diode Dd on the drain coupling side are formed between the positive-type well region 103 and the source electrode S or the drain electrode D (or region directly below the gate electrode G) as shown in FIGS. 5A–6B, the positive-type well region 103 is short-circuited to the drain electrode D because of the need to apply a potential to the positive-type well region 103. In other words, with the three-phase full wave rectifier 7 of the motor vehicle alternator 3, the positive-type well region 103 is generally coupled to either the source electrode S or the drain electrode D due to the need to apply a potential to the positive-type well region. Where the positive well region 103 is connected to the source electrode S, thereby short-circuiting the parasitic diode Ds on the source coupling side, a reverse current may flow through the parasitic diode Dd on the drain coupling side when the generated voltage fed to the drain electrode D of the MOSFET body 71 of the positive SiC-MOSFET 51 becomes lower than the battery voltage. Similarly, a reverse current may flow through the parasitic diode Dd on the drain coupling side when the generated voltage fed to the source electrode S of the MOSFET body 73 of the negative SiC-MOSFET 53 becomes higher than the potential of the negative terminal of the battery (ground potential). To prevent such a reverse current from flowing through the parasitic diode Dd on the drain coupling side, the positive-type well region 103 is short-circuited to the drain electrode D, so that the parasitic diode Ds of the source coupling side stops the reverse current from the battery 2. The same thing will apply to the case of the positive-type channel in FIG. 6B.

The voltage regulator 8 will now be described with reference to FIGS. 3 and 4. The voltage regulator 8 is a so-called M type IC regulator and includes a shield casing 90 made of an insulating resin material such as PPS resin, generated power detection terminals 91 to 93 sealed so that a part of the terminals is covered within the shield casing 90, a lead frame for external input/output terminals 94, 95 and exciting current output terminals 96, 97, a controller 98 and a radiating fin (not shown).

The generated power detection terminals 91 to 93 are terminals (occasionally called as external terminals or IG terminals) electrically connected to a U-phase output end Vu, a V-phase output end Vv, and a W-phase output end Vw, and the terminals are almost entirely covered within the shield casing 90, except for connections thereto. The external input/output terminal 94 is a terminal (occasionally called as an external input terminal, or an IG terminal) having one end electrically connected to the controller 98 and the other end electrically connected to an ignition switch through a wire (both not shown). The external input/output terminal 94 is almost entirely sealed within the shield casing 90 except for the connecting portions of the terminal 94. The external input/output terminal 95 is for a regulator sensor for detecting the battery voltage and is a terminal VB (occasionally called as a battery voltage input terminal, an external input terminal, or an S terminal) having one end electrically connected to the controller 98 and another end electrically connected to the positive electrode (not shown) of the battery 2 through a wire (not shown). The external input/output terminal 95 is almost entirely sealed within the shield casing 90 except for the connecting portions of the terminal 95. The exciting current output terminals 96, 97 are terminals (occasionally called F terminals) having one end electrically connected to the controller 98 and another end electrically connected to the terminals of the brushes 21 by threading fixtures such as screws. The external input/output terminals 96, 97 are almost entirely sealed within the shield casing 90 except for the connecting portions of the terminals 96, 97.

The controller 98 includes integrated circuits as well as power transistors (i.e., transistors for excitation current output), semiconductor switching elements such as transistors for absorbing reversed electromotive force, and other electrical parts such as many resistors.

Referring now to FIGS. 1 to 12, the operation of the automobile alternator system 1 is described. First, electric power is fed to the engine starter from the battery 2 when the ignition switch is turned on, thereby starting the engine starter to start the engine. The rotational power of the engine is transmitted to the V-ribbed pulley 14 through a transmission device such as the poly-V belt, and thereby the rotor 4 is rotated by rotation of the shaft 9, which is rotatably supported by the two ball bearing assemblies 13 at the drive frame 26 and the rear frame 27. The pole core 10, the field winding 11, and two slip rings 12 rotate together with the shaft 9 at that time.

The power transistors (not shown) in the controller 98 are continuously turned on by turning the ignition switch, thereby permitting flow of an excitation current from battery 2 to the body through the DC output terminal 41, the brushes 21, the slip rings 12, the shaft connection bars 19, the field winding 11, the shaft connection bars 19, the slip rings 12, the brushes 21, the exciting current output terminals 96, 97, the power transistors in the controller 98, the terminal for ground, and the rear cover 28. Accordingly, the pair of claw pole members of the pole core 10 are excited when the excitation current flowing through the field winding 11 by application of the voltage from the battery 2 to the field winding 11. One of the claw pole members has entirely a north magnetic polarity whereas the other of the claw pole members has entirely a south magnetic polarity. An AC current is induced at the three-phase armature winding 25 wound around the armature core of the stator 5, which rotates relative to the rotor 4, thereby quickly increasing the generated voltage. The three-phase AC current is fed to the three-phase full wave rectifier 7 through the AC input terminals 61 to 63. That is, the three-phase AC current is fed to the three positive SiC-MOSFETs 51 to 53 and the three negative SiC-MOSFETs 54 to 56 and is converted into DC current by rectification.

When the generated voltage at the three-phase armature winding 25 (or voltage at the DC output terminal or the B terminal) exceeds the battery voltage, the rectified DC current, or charging current for the battery, is fed to the battery 2 through the three positive SiC-MOSFETs 51 to 53, the positive radiating fin 42, and the DC output terminal 41. The charging current charges the battery 2.

As for operation of the positive and negative SiC-MOSFETs 51 to 56, first, the positive SiC-MOSFETs 51 to 53 operate to be turned on and off by the following timings. That is, while an output voltage of the armature winding 25 of a certain phase exceeds the battery voltage VB, the corresponding positive SiC-MOSFET 51, 52 or 53 is turned on. When the output voltage of the armature winding 25 of that phase falls below the battery voltage VB, the corresponding MOSFET is turned off. Similarly, the negative SiC-MOSFETs 54 to 56 are turned on and off by the following timings. That is, while an output voltage of the armature winding 25 of a certain phase is below the ground voltage VE, the corresponding negative SiC-MOSFET 54, 55 or 56 is turned on. When the output voltage of the armature winding 25 of that phase exceeds the ground voltage VE, the corresponding MOSFET is turned off. In this way, the SiC-MOSFET type three-phase full wave rectifier 7 can perform substantially the same operation as a conventional three-phase full wave rectifier using silicon diodes.

The rotor 4, the stator 5 and the three-phase full wave rectifier 7 of the automobile alternator system 1 generate heat responsive to current flow therethrough. The heat is dissipated by cooling air blown into the housing 6 by rotation of the cooling fans 16, 17 attached to the claw pole member pair upon the rotation of the pole core 10. Specifically, the field winding 11 of the rotor 4 and the three-phase armature winding 25 of the stator 5 are directly cooled by the cooling air from the cooling fans 16, 17 sent through many louvers 31, 33 formed in the drive frame 26 and the rear frame 27 as well as the rear cover 28 as shown in FIG. 3. Heat generated at the three positive SiC-MOSFETs 51 to 53 and the three negative SiC-MOSFETs 54 to 56 of the three-phase full wave rectifier 7 is dissipated through the cooled positive and negative radiating fins 42, 43 by cooling wind or air sent to the positive and negative radiating fins 42, 43 through many louvers formed in the rear cover 28 as shown in FIG. 3.

As described above, the sealing member 72 made of a molding resin such as epoxy resin seals the positive SiC-MOSFETs 51 to 53 of the three-phase full wave rectifier 7 of the automobile alternator system 1 on the surface of the positive radiating fin 42, together with the respective positive MOSFET bodies 71, including the drain electrode D, the source electrode S, and the gate electrode G. Similarly, the sealing member 74 made of a molding resin such as epoxy resin seals the negative SiC-MOSFETs 54 to 56 of the three-phase full wave rectifier 7 of the automobile alternator system 1 on the surface of the negative radiating fin 43, together with the respective negative MOSFET bodies 73, including the drain electrode D, the source electrode S, and the gate electrode G.

As a result, the sealing members 72, 74 evenly dissipate stress even if the positive and negative radiating fins 42, 43 and the terminal plate 44 for the automobile alternator system 1, which are attached directly to the engine and may receive the vibration of the engine, have vibration modes which are different from one another. Since the rigidity of the positive and negative MOSFET bodies 71, 73 is surely guaranteed even under great vibration, the automobile alternator system 1 can avoid damage to the positive and negative MOSFET bodies 71, 73. Moreover, the positive and negative MOSFET bodies 71, 73 as well as the respective electrodes are never exposed to atmospheric air, so that the positive and negative MOSFET bodies 71, 73 and the respective electrodes have improved resistance to adverse operating conditions.

The positive and negative MOSFET bodies 71, 73 using SiC dissipate less power (and consequently generate less heat) and have a higher heat resistance temperature than comparable silicon devices. The positive and negative MOSFET bodies 71, 73 can safely operate even if they are at a high temperature because heat is accumulated inside the sealing members 72, 74, so that it is unnecessary to provide a sizable cooling device specially for the positive and negative MOSFET bodies 71, 73. Therefore, the number of parts for the automobile alternator system 1 can be reduced, the production costs of the automobile alternator system 1 can be reduced, and the costs of the automobile equipped with such a very inexpensive automobile alternator system 1 can be reduced. In addition, the positive and negative radiating fins 42, 43 for cooling the positive and negative MOSFET bodies 71, 73 can be made compact.

The three-phase full wave rectifier 7 can be assembled neatly along the inner wall of the rear cover 28 of the motor vehicle alternator 3 so that the positive and negative radiating fins 42, 43 having a crescent shape overlap in different planes, or have a double-decker configuration. Since the positive and negative radiating fins 42, 43 can be formed with sufficient areas thereof, the cooling performance on the MOSFET bodies 71, 73 can be improved. Since the MOSFET bodies 71, 73 can be cooled sufficiently even if the positive and negative radiating fins 42, 43 are made smaller, the MOSFET bodies 71, 73 on the surfaces of the positive and negative radiating fins 42, 43 can be aligned at a narrower interval, thereby allowing the outer diameter of the housing 6 of the motor vehicle alternator 3 to be smaller.

With this embodiment, while the positive and negative SiC-MOSFETs 51 to 56 are turned off, if a high voltage (for example, 300 volts) is applied between the source and drain electrodes S, D, the SiC-MOSFETs mainly extend the depletion layer 107 into the negative-type anti-breakdown layer 102 to resist such a high voltage. Consequently, the negative-type anti-breakdown layer 102 serves as a source feedback resistor Rs and may create power loss due to the resistance of itself and a channel resistance enhancement effect. However, with this embodiment, the thickness and impurity concentration of the negative-type anti-breakdown layer 102 can significantly be improved in comparison with that of the conventional Si-MOSFETs, since single crystal SiC is used.

Now, consider a design of the negative-type anti-breakdown layer 102 when the breakdown voltage of the negative-type anti-breakdown layer 102 is 300 volts. In the case of Si, the breakdown electrical field intensity is about 30 volts per micron. Thus, for a breakdown voltage of 300 volts, the negative-type anti-breakdown layer 102 has to have a thickness of about 20 microns, an impurity concentration of $1\times10^{15}$ atoms per cubic centimeter, and a resistivity of about 5 ohm-centimeters. Meanwhile, if the breakdown voltage of SiC is about 400 volts per micron, the negative-type anti-breakdown layer 102 has to have a thickness of about 4 microns, an impurity concentration of $2\times10^{15}$ atoms per cubic centimeter, and a resistivity of about 1.25 ohm-centimeters. Accordingly, the resistance of the negative-type anti-breakdown layer 102 of the SiC-MOSFET can be reduced down to one-twentieth of the resistance of the negative-type anti-breakdown layer 102 of the Si-MOSFET. In conclusion, the source feedback resistance Rs in the SiC-MOSFETs of the embodiment can be reduced down to one-twentieth of the resistance of the source feedback resistance Rs in the Si-MOSFETs, and the channel resistance can be correspondingly reduced to a great extent, thereby realizing an extremely low-loss (i.e., low heat generation) three-phase full wave rectifier 7 of the motor vehicle alternator 3 from such synergetic effects. That is, a three-phase full wave rectifier 7 having excellent effects, which cannot be predicted from the conventional art, can be obtained by improving the breakdown voltage of the negative-type anti-breakdown layer 102 by using SiC as a semiconductor material. The relationship above is similarly applicable when a high voltage other than 300 volts is applied to the negative-type anti-breakdown layer 102.

Figure 7:
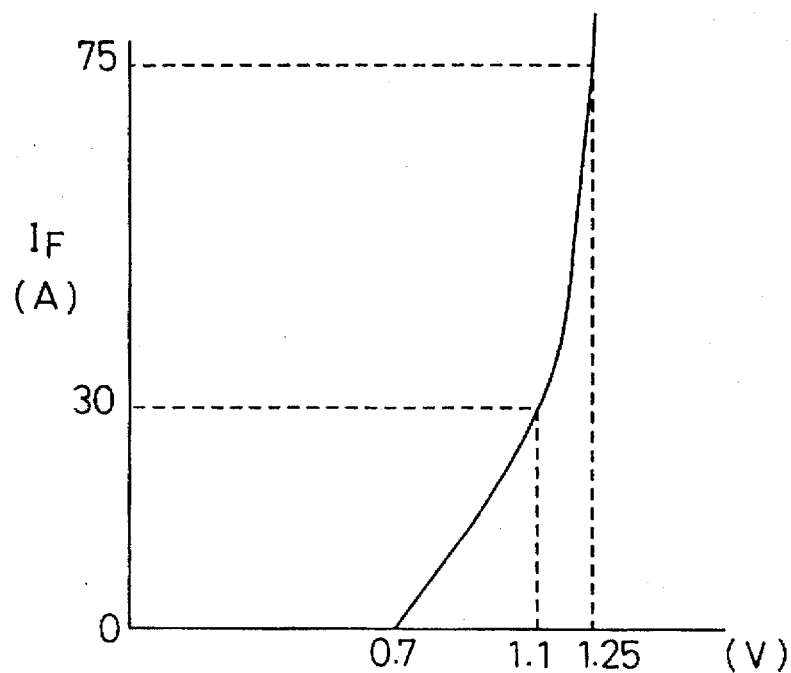
FIGS. 7–9 are graphs showing relationships between voltage and current of a conventional pn-junction silicon diode, a silicon MOSFET as a comparative example, and a silicon carbide-MOSFET according to the embodiment, respectively.
Figure 8:
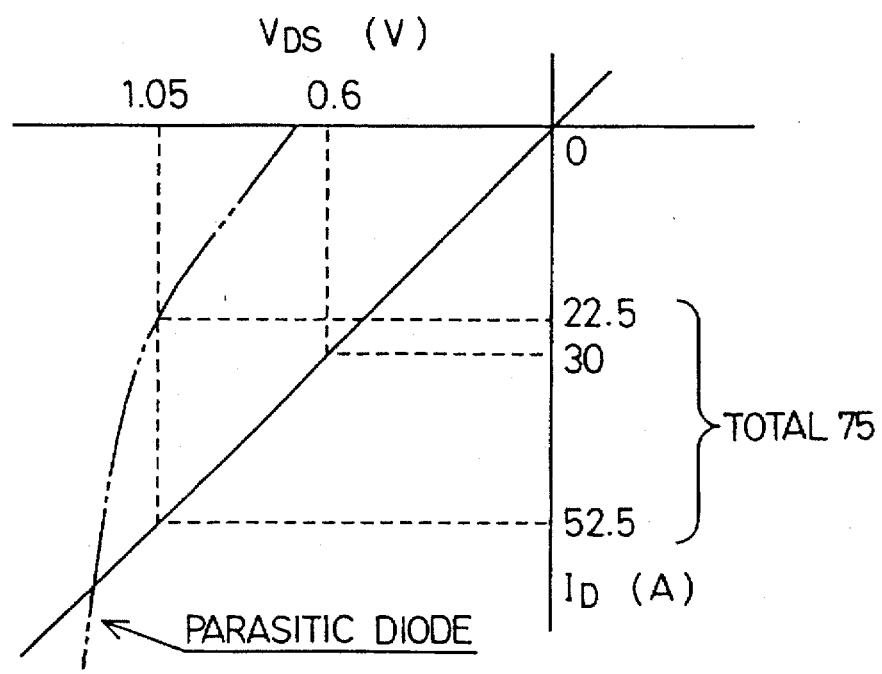
Figure 9:
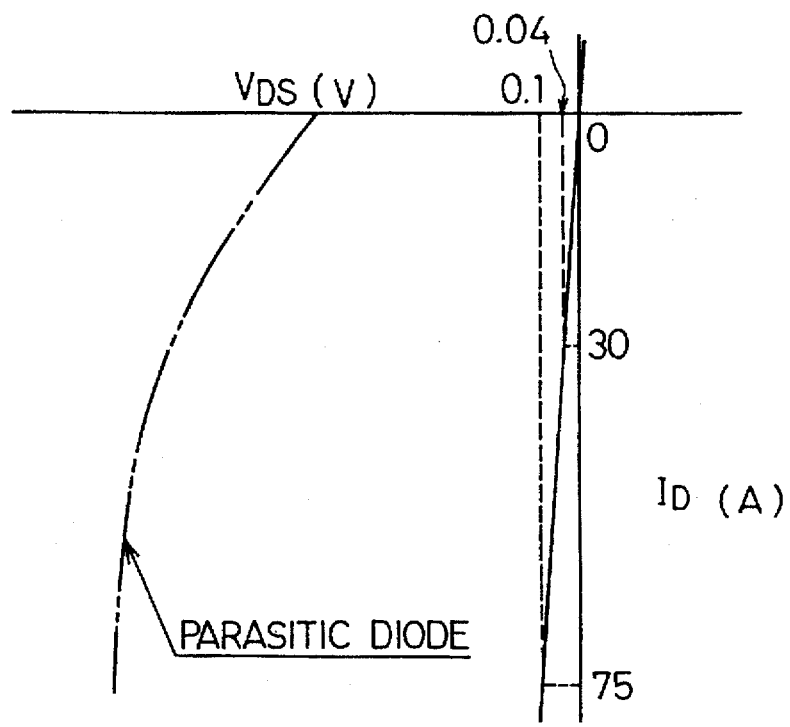

FIGS. 7 to 9 show voltage-current characteristics of a pn-junction Si diode (Conventional) and a SiC-MOSFET (Embodiment), which are manufactured with the same chip size under the same design rule. The breakdown voltage of these devices is designed to be 250 volts. FIG. 7 is a graph showing tested characteristics of a pn-junction diode made of Si; FIG. 8 is a graph showing tested characteristics of a Si-MOSFET made of Si; FIG. 9 is a graph showing tested characteristics of the SiC-MOSFET made of SiC. As apparent from FIGS. 7 to 9, the three-phase full wave rectifier 7 of this embodiment can reduce the electric power loss 90 percent or more in comparison with the conventional three-phase full wave rectifier when delivering an output current of 75 A.

Figure 10:
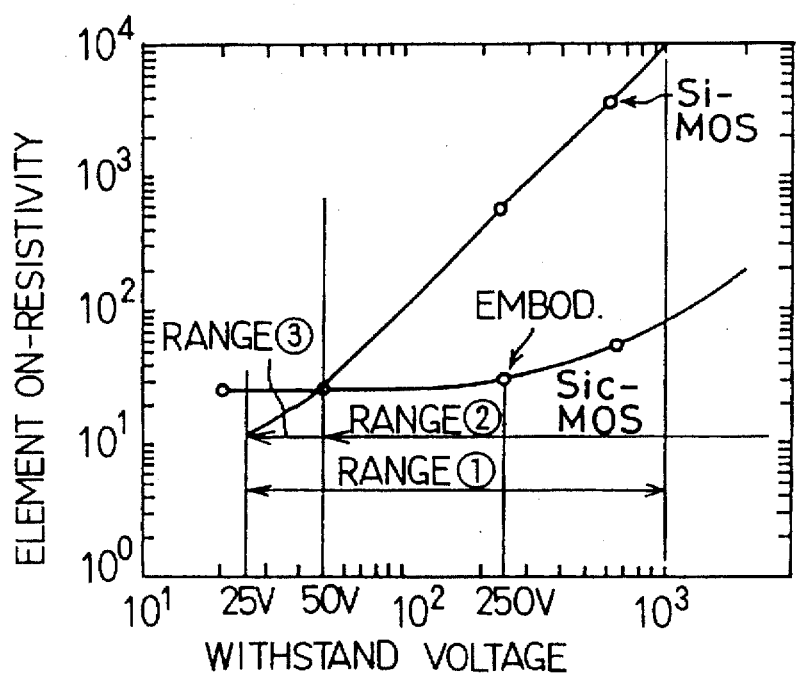
FIG. 10 is a graph showing a relationship between breakdown voltage and channel resistance of the silicon MOSFET as the comparative example and the silicon carbide MOSFET as of the embodiment.

FIG. 10 is a graph showing a calculated example of the on-resistance when the required voltage for the MOSFET is changed. Though the on-resistance rate is the summation of the channel resistance and the resistance of the negative-type anti-breakdown layer 102, the channel resistance particularly may be shifted depending on various factors, and as is apparent from the graph of FIG. 10, the resistance of the negative-type anti-breakdown layer 102 is controlling in a high breakdown voltage region. That is, although the channel resistance may hardly change even if the breakdown voltage is increased (when the increase in the channel resistance by the feedback effects from the increased source feedback resistance Rs is neglected), the resistance of the negative-type anti-breakdown layer 102 is increased while maintaining the positive breakdown voltage relation. Accordingly, the SiC-MOSFET barely permits an increase in the resistance of the negative-type anti-breakdown layer 102 up to the breakdown voltage of 250 volts and a slow increase in the on-resistance rate as the voltage exceeds the breakdown voltage of 250 volts.

Figure 11:
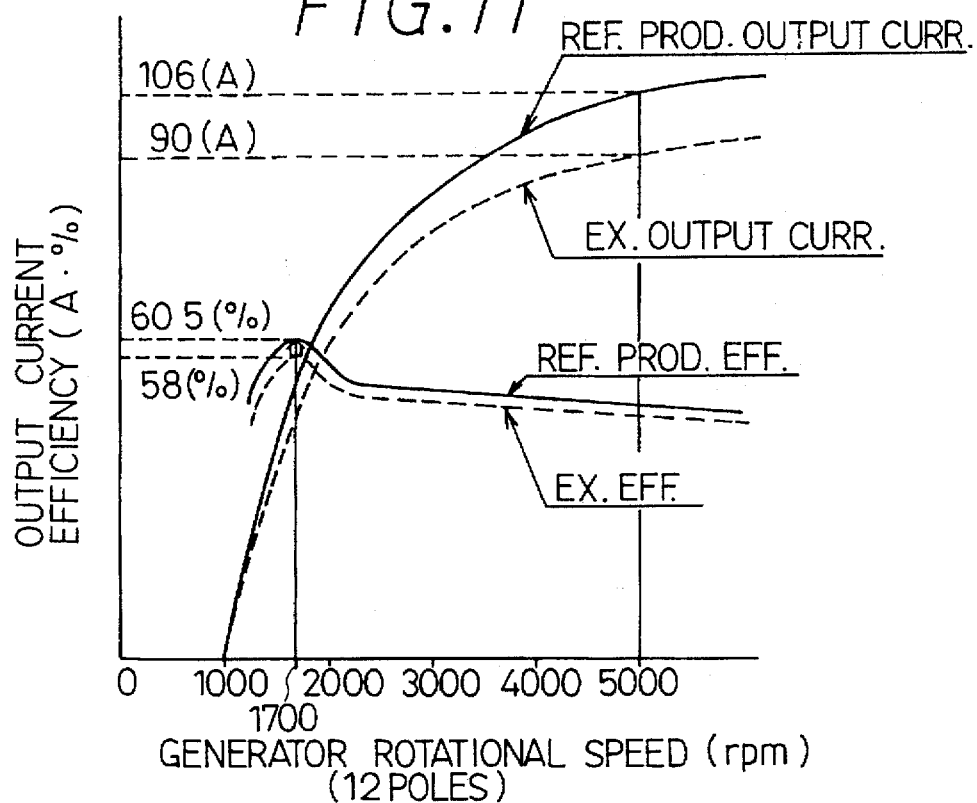
FIG. 11 is a graph showing a relationship between speed and output current and between speed and efficiency in the motor vehicle alternator when three-phase full wave rectifiers of the silicon MOSFET type and of the silicon carbide MOSFET type are used.
Figure 12:
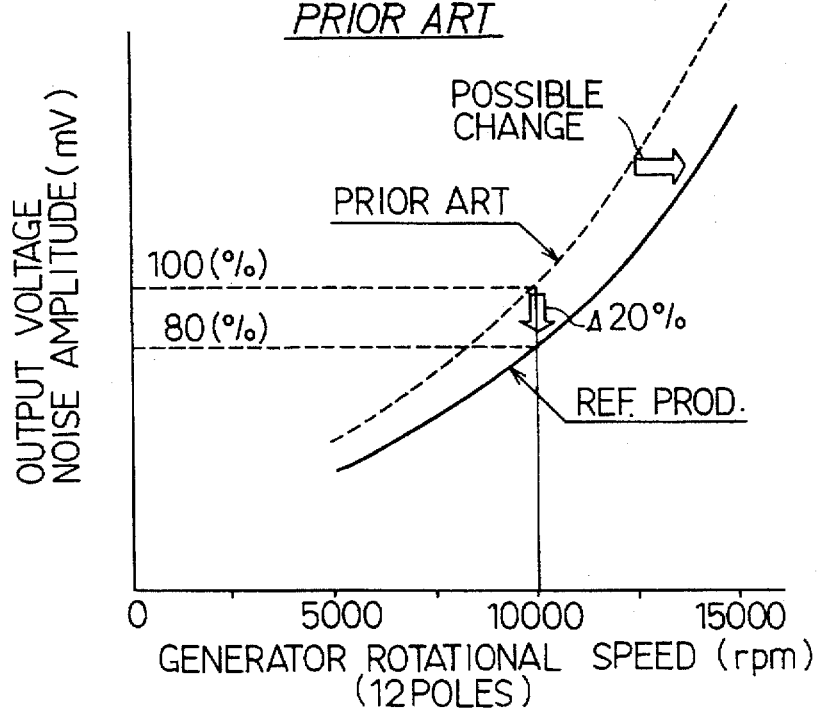
FIG. 12 is a graph showing a relationship between noise voltage and speed in the motor vehicle alternator when three-phase full wave rectifiers of the silicon MOSFET type and of the silicon carbide MOSFET type are used.
Figure 13:
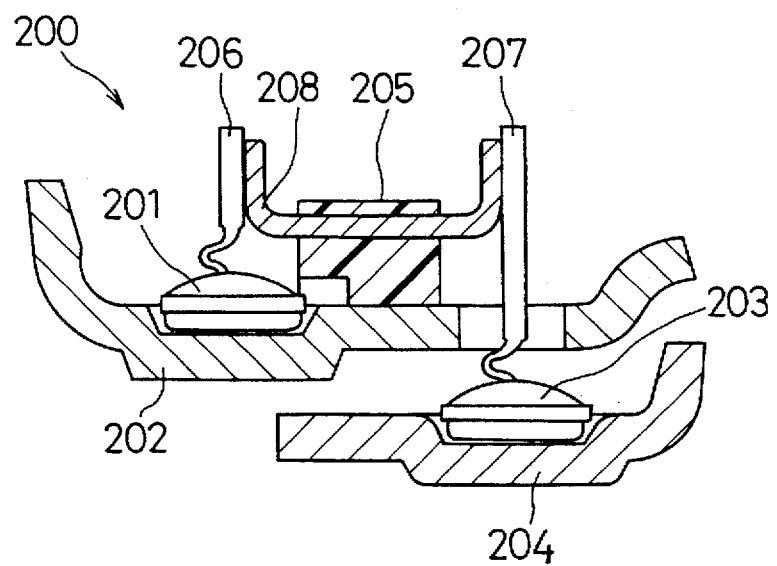
FIG. 13 shows a prior art rectifier.

FIGS. 11, 12 are graphs showing characteristics of the motor vehicle alternator 3 using the three-phase full wave rectifier 7 in which the SiC-MOSFETs (Embodiment) and the Si-MOSFETs (Comparative example) having the same chip size are incorporated. The output current is improved about 10 percent (in an alternator having 12 poles and running at 5,000 rpm), and the rectifying efficiency is also improved about 3 to 5 percent because the rectification loss may be neglected.

According to this embodiment, compact radiating fins can be realized because the three-phase full wave rectifier 7 can greatly reduce its rate of heat generation, thereby allowing the three-phase full wave rectifier 7 and the voltage regulator 8 of the controller 98 to be formed as an integral unit. By forming the three-phase full wave rectifier 7 and the controller 98 for controlling the operation of the three-phase full wave rectifier 7 in such an integral unit, it is possible to eliminate interconnections for coupling both and to reduce electromagnetic noise emitted from those interconnections. Therefore, in comparison with the conventional automobile alternator, the louvers can be exposed without use of any rear cover to cover the louvers, and as a result, the space for mounting the three-phase full wave rectifier can be reduced in the motor vehicle alternator, so that air resistance and power for sending air can be correspondingly reduced.

Moreover, as shown in the graph of FIG. 12, the SiC-MOSFET type three-phase full wave rectifier of this embodiment (Embodiment) can reduce the noise voltage contained in the rectified output voltage about 20 percent in comparison with the conventional Si-MOSFET type three-phase full wave rectifier (Prior art) where a AC alternator of 12 poles and 100 A output is rotated at 10,000 rpm. This is because potential changes on both ends of the three-phase armature winding 25 accompanying switching operations of the positive and negative SiC-MOSFETs 51 to 56 are suppressed, since the positive and negative SiC-MOSFETs 51 to 56 have small resistances.

In this embodiment, although the embodiment is implemented in an automobile alternator system 1 as a vehicle alternator, the invention is equally applicable to rectifying voltage regulators of other internal combustion engines, electric motors, and other AC generators driven by a drive source such as a waterwheel or windmill. In this embodiment, although the controller 98 for controlling the operation of the three-phase full wave rectifier 7 is contained within the motor vehicle alternator 3, the controller 98 can be provided outside the motor vehicle alternator 3. The controller 98 can be incorporated in or can be provided externally to the three-phase full wave rectifier 7. Moreover, this invention is applicable to a motor vehicle alternator 3 having a poly-phase full wave rectifier other than the three-phase rectifier, or having a single-phase half wave rectifier or a poly-phase half wave rectifier.

The poly-phase full wave rectifier such as the three-phase full wave rectifier of the alternator can include SiC-MOSFETs held on one of the positive and negative radiating fins and of pn-junction diodes held on the other of the positive and negative radiating fins. The pn-junction diode can be made of silicon or silicon carbide.

The high concentration negative-type substrate 101 can constitute a common high concentration negative-type source region of the respective MOSFET bodies 71 of the positive SiC-MOSFETs 51 to 53. The positive-type well region 103 for each phase of the three-phase armature winding 25 can be formed separately on the high concentration negative-type substrate 101. In this case, high concentration negative-type drain regions 104 may be individually formed on the respective surfaces of the positive-type well regions 103. In addition, respective gate electrodes G can be individually formed by forming an insulating layer such as a gate insulator film 106 on the surfaces of the positive-type well regions 103 for creating channels for individually conducting between the respective high concentration negative-type drain regions 104 and the respective negative-type anti-breakdown layers 102. The positive SiC-MOSFETs 51 to 53 can be formed on a single chip so that the number of the parts can be reduced and so that the poly-phase full wave rectifier can be made compact. It is to be noted that SiC-MOSFETs using silicon carbide as a semiconductor material and silicon oxide thermally produced as a surface insulator can be used as a power transistor in the controller 98 incorporated in the voltage regulator 8.

Although the present invention has been fully described in connection with the preferred embodiment thereof with reference to the accompanying drawings, it is to be noted that various changes and modifications will become apparent to those skilled in the art. Such changes and modifications are to be understood as being included within the scope of the present invention as defined by the appended claims.

What is claimed is:

1. An alternator for charging a battery, said alternator comprising:

a magnetic device for being rotatably driven by a drive source;

an armature having an armature winding for generating an AC output responsive to rotation of said magnetic device; and a rectifier including a rectifying device for converting said AC output to a DC output by rectifying said AC output, a radiating fin for radiating heat from said rectifying device, and a terminal plate holding a plurality of external input/output terminals electrically coupled to said rectifying device;

wherein said rectifying device includes at least one silicon carbide MOSFET and an electrically insulating sealing member for sealing said at least one MOSFET with at least one of said radiating fin and said external input/output terminals by covering said at least one of said radiating fin and said external input/output terminals.

2. The alternator according to claim 1, further comprising:

a housing having said rectifier mounted therein;

wherein said rectifier has a crescent-shape conforming to an internal configuration of said housing.

3. The alternator according to claim 2, wherein said radiating fin has a double-decker form including at least two layers, one of said layers being a positive radiating fin to be connected to a positive electrode of said battery, and another layer of which is a negative radiating fin to be connected to a negative electrode of said battery.

4. The alternator according to claim 2, wherein said rectifier includes a silicon carbide MOSFET held on one of said positive radiating fin and said negative radiating fin, and a pn-junction diode made of one of silicon and silicon carbide held on the other of said positive radiating fin and said negative radiating fin.

5. The alternator according to claim 1, wherein said at least one MOSFET includes a MOSFET, fixed on a portion of said radiating fin having a positive potential, for rectifying a positive portion of said AC output of said armature.

6. The alternator according to claim 1, further comprising:

a housing having said rectifier mounted therein;

wherein aid rectifier has a crescent-shape conforming to an internal configuration of said housing.

7. The alternator according to claim 6, wherein said radiating fin has a double-decker form including at least two layers, one of said layers being a positive radiating fin to be connected to a positive electrode of said battery, and another layer of which is a negative radiating fin to be connected to a negative electrode of said battery.

8. The alternator according to claim 6, wherein said rectifier includes a silicon carbide MOSFET held on one of said positive radiating fin and said negative radiating fin, and a pn-junction diode made of one of silicon and silicon carbide held on the other of said positive radiating fin and said negative radiating fin.

9. An alternator for charging a battery, said alternator comprising:

a field magnet for being rotatably driven by a drive source;

an armature having an armature winding for generating an AC output responsive to rotation of said field magnet;

a rectifier including a rectifying device for converting said AC output to a DC output by rectifying said AC output, a radiating fin for radiating heat from said rectifying device, and a terminal plate holding a plurality of external input/output terminals electrically coupled to said rectifying device;

a housing having said rectifier mounted therein, said rectifier having a crescent-shape conforming to an internal configuration of said housing;

wherein said rectifying device includes at least one silicon carbide MOSFET and an electrically insulating sealing member for sealing said at least one MOSFET with at least one of said radiating fin and said external input/output terminals by covering said at least one of said radiating fin and said external input/output terminals;

said rectifier is a polyphase full wave rectifier for converting said AC output which is generated in polyphase armature windings of said alternator to said DC output by rectifying both positive and negative portions of said AC output;

said at least one MOSFET includes a plurality of MOSFETs made of silicon carbide including a plurality of positive MOSFETs located on a positive radiating fin which are sealed by said sealing member, and a plurality of negative MOSFETs located on a negative radiating fin, which are sealed by said sealing member;

each positive MOSFET includes, on a surface thereof, a drain electrode electrically coupled to an AC input terminal for receiving said AC output generated in said armature windings, a source electrode electrically coupled to said positive radiating fin, and a gate electrode electrically coupled to a controller; and each negative MOSFET includes, on a surface thereof, a drain electrode electrically coupled to said negative radiating fin, a source electrode electrically coupled to said AC input terminal, and a gate electrode electrically coupled to said controller.

10. The alternator according to claim 9, wherein breakdown voltages between said source electrode and said drain electrode and between said drain electrode and said gate electrode in said positive MOSFETs and said negative MOSFETs are at least fifty volts.

11. The alternator according to claim 9, wherein breakdown voltages between said source electrode and said drain electrode and between said drain electrode and said gate electrode in said positive MOSFETs and said negative MOSFETs are at least 100 volts.

12. The alternator according to claim 9, wherein at least one MOSFET in said plurality of positive MOSFETs and said plurality of negative MOSFETs includes:

a high density negative-type substrate on a back surface of which said source electrode is formed;

a negative-type anti-breakdown layer formed on a major surface of said high density negative-type substrate;

a positive-type well region formed on a surface of said negative-type anti-breakdown layer;

a high density negative-type drain region formed on a surface of said positive-type well region with said drain electrode formed on a surface of said drain region;

wherein said gate electrode is formed on said surface of said positive-type well region through an insulating layer to form a negative-type channel conducting between said drain region and said negative-type anti-breakdown layer.

13. The alternator according to claim 12, wherein breakdown voltages between said source electrode and said drain electrode and between said drain electrode and said gate electrode in said positive MOSFETs and said negative MOSFETs are at least fifty volts.

14. The alternator according to claim 12, wherein breakdown voltages between said source electrode and said drain electrode and between said drain electrode and said gate electrode in said positive MOSFETs and said negative MOSFETs are at least 100 volts.

15. The alternator according to claim 12, wherein said high density negative-type drain region and said positive-type well region are short-circuited to each other.

16. The alternator according to claim 15, wherein breakdown voltages between said source electrode and said drain electrode and between said drain electrode and said gate electrode in said positive MOSFETs and said negative MOSFETs are at least fifty volts.

17. The alternator according to claim 15, wherein breakdown voltages between said source electrode and said drain electrode and between said drain electrode and said gate electrode in said positive MOSFETs and said negative MOSFETs are at least 100 volts.

18. The alternator according to claim 15, wherein:

said high density negative-type substrate constitutes a high density negative-type common source region of respective MOSFETs;

respective positive-type well regions are formed on said high density negative-type substrate corresponding to phases of said polyphase armature windings;

an individual high density negative-type drain region is formed on each positive-type well region; and an individual gate electrode is formed on each positive-type well region through said insulating layer to form a negative-type channel individually conducting between a corresponding high density negative-type drain region and said negative-type anti-breakdown layer.

19. The alternator according to claim 18, wherein breakdown voltages between said source electrode and said drain electrode and between said drain electrode and said gate electrode in said positive MOSFETs and said negative MOSFETs are at least fifty volts.

20. The alternator according to claim 18, wherein breakdown voltage between said source electrode and said drain electrode and between said drain electrode and said gate electrode in said positive MOSFETs and said negative MOSFETs are at least 100 volts.

21. The alternator according to claim 9, wherein:

said plurality of positive MOSFETs are disposed on said positive radiating fin and covered together with said drain electrode, said source electrode, and said gate electrode by said sealing member; and said plurality of negative MOSFETs are disposed on said negative radiating fin and covered together with said drain electrode, said source electrode, and said gate electrode by said sealing member.

22. An alternator for charging a battery, said alternator comprising:

a field magnet for being rotatably driven by a drive source;

an armature having an armature winding for generating an AC output responsive to rotation of said field magnet; and a rectifier including a rectifying device for converting said AC output to a DC output by rectifying said AC output, a radiating fin for radiating heat from said rectifying device, and a terminal plate holding a plurality of external input/output terminals electrically coupled to said rectifying device;

wherein said rectifying device includes at least one silicon carbide MOSFET and an electrically insulating sealing member for sealing said at least one MOSFET with at least one of said radiating fin and said external input/output terminals by covering said at least one of said radiating fin and said external input/output terminals; and said at least one MOSFET is mounted on a plate on which a controller for switching said at least one MOSFET is mounted.

* * * * *